United States Patent
Tu et al.

(10) Patent No.: US 9,924,269 B1
(45) Date of Patent: Mar. 20, 2018

(54) FILTER GAIN COMPENSATION METHOD FOR SPECIFIC FREQUENCY BAND USING DIFFERENCE BETWEEN WINDOWED FILTERS

(71) Applicant: Acer Incorporated, New Taipei (TW)

(72) Inventors: Po-Jen Tu, New Taipei (TW); Jia-Ren Chang, New Taipei (TW); Kai-Meng Tzeng, New Taipei (TW)

(73) Assignee: ACER INCORPORATED, New Taipei (TW)

( * ) Notice: Subject to any disclaimer, the term of this patent is extended or adjusted under 35 U.S.C. 154(b) by 0 days.

(21) Appl. No.: 15/697,646

(22) Filed: Sep. 7, 2017

(30) Foreign Application Priority Data

Oct. 20, 2016 (TW) .............................. 105133839 A

(51) Int. Cl.
*H04R 3/04* (2006.01)
*H03G 5/16* (2006.01)
(52) U.S. Cl.
CPC ............... *H04R 3/04* (2013.01); *H03G 5/165* (2013.01)
(58) Field of Classification Search
CPC .................................. H04R 3/04; H03G 5/165
USPC ....................................................... 381/103
See application file for complete search history.

(56) References Cited

U.S. PATENT DOCUMENTS

| | | | | |
|---|---|---|---|---|
| 9,672,834 | B2* | 6/2017 | Pandey | G10L 19/022 |
| 2002/0057808 | A1* | 5/2002 | Goldstein | H04R 25/356 |
| | | | | 381/106 |
| 2012/0082330 | A1* | 4/2012 | Kornagel | H03G 9/005 |
| | | | | 381/320 |
| 2012/0109006 | A1* | 5/2012 | James | A61N 1/37247 |
| | | | | 600/559 |
| 2013/0287236 | A1* | 10/2013 | Kates | H04R 25/505 |
| | | | | 381/312 |

\* cited by examiner

*Primary Examiner* — David Ton
(74) *Attorney, Agent, or Firm* — McClure, Qualey & Rodack, LLP

(57) ABSTRACT

A filter gain compensation method for a specific frequency band for use in an electronic device is provided. In the method, a windowed filter is applied on each of a plurality of band-pass filters in a multi-segment band-pass filter corresponding to the high-frequency signal and different frequency bands of the low-frequency signal. In addition, a high-frequency cancellation filter corresponding to the high-frequency signal of an input digital signal is calculated. A compensation gain for the high-frequency cancellation filter and each of the band-pass filters is calculated according to fitting frequency gains and a fitting frequency relationship matrix. The output acoustic signal is synthesized using output signals from the windowed band-pass filters and the high-frequency cancellation filter that are obtained according to updated filter features and compensation gain for the windowed band-pass filters and the high-frequency cancellation filter.

10 Claims, 9 Drawing Sheets

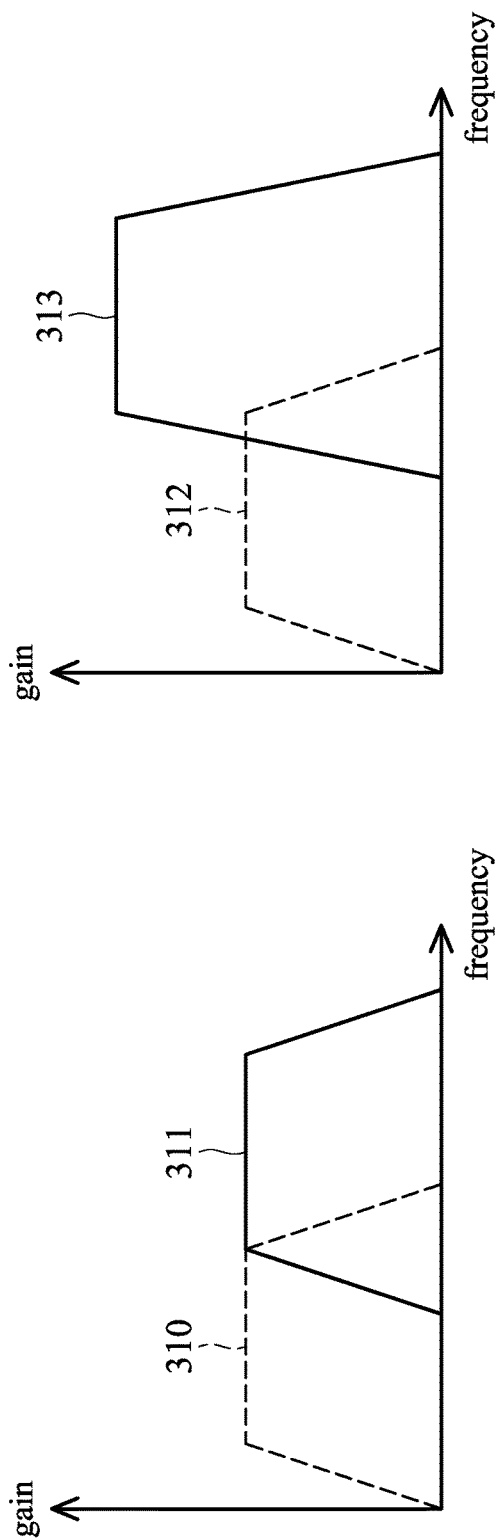

FILTER GAIN COMPENSATION METHOD FOR SPECIFIC FREQUENCY BAND USING DIFFERENCE BETWEEN WINDOWED FILTERS

CROSS REFERENCE TO RELATED APPLICATIONS

This Application claims priority of Taiwan Patent Application No. 105133839, filed on Oct. 20, 2016, the entirety of which is incorporated by reference herein.

BACKGROUND OF THE INVENTION

Field of the Invention

The present invention relates to electronic devices, and, in particular, to an electronic device and an associated filter gain compensation method for a specific frequency band.

Description of the Related Art

Techniques for wide dynamic range compression (WDRC) are widely used in hearing aids. After long-term research, the activation time around 5 ms used in a hearing aid may fit the needs of most hearing-impaired people, but the recovery time may vary depending on different environments. FIG. 1 is a diagram of a hearing compensation curve of an input acoustic signal after WDRC. Curve 110 represents the transition curve of an unprocessed input acoustic signal. Curve 120 represents the transition curve of a processed input acoustic signal by WDRC, and FIG. 1 can be roughly divided into four regions 131~134. The strength of an acoustic signal can be expressed by a sound pressure level in units of dB (i.e. dB SPL).

Region 131 is a high linear region (e.g. over 90 dB SPL), and it indicates that a hearing-impaired person has the same saturated sound pressure as that of common people, and the input acoustic signal in region 131 should not be amplified. Region 132 indicates a compression region (e.g. between 55~90 dB SPL), and is used for adjusting the dynamic range of the user's audible area. Region 133 indicates a low linear region (e.g. between 40~55 dB SPL), and is used for amplifying a weak speech acoustic signal. Region 134 indicates an expansion region (e.g. lower than 40 dB SPL). Because the strength of the acoustic signal in region 134 may be very weak, the input acoustic signal may be noise signals that are weaker than a speech acoustic signal, and thus the input acoustic signal in region 134 should not be amplified too much. Additionally, there is also a volume limiter at the output terminal of the hearing aid for limiting the maximum volume of the output acoustic signal, for example, limiting the output volume to within 110 dB SPL.

Generally, when a hearing-impaired person wears a hearing aid, gains for different frequencies on the hearing attenuation curve of the hearing-impaired person are compensated individually. Each frequency of the input acoustic signal has different gain. The input acoustic signal can be divided into a plurality of frequency bands. If the number of frequency bands in the input acoustic signal is too large, the range of each frequency band is relatively small. For example, the input acoustic signal can be converted from the time domain to the frequency domain via Fourier transform operations, and thus the gain corresponding to each frequency can be adjusted individually. However, the complexity of Fourier transform operations is very high, resulting in a serious burden for the acoustic processing circuit of the hearing aid.

In addition to the hearing aid, there is a need for a hearing-impaired user to use a portable electronic device (e.g. smartphone or tablet PC), and no hearing aid is worn by the hearing-impaired user while using the portable electronic device. Since the output acoustic characteristics of the speaker on the portable electronic device are not designed for hearing-impaired users, roaring sounds can be induced while playing the high-frequency portion of the output acoustic signal on the speaker of the portable electronic device if a conventional WDRC method for the hearing aids is used on the portable electronic device, resulting in poor user experience for the hearing-impaired user when using the portable electronic device.

Accordingly, there is demand for an electronic device and an associated filter gain compensation method for a specific frequency band to solve the aforementioned problem.

BRIEF SUMMARY OF THE INVENTION

A detailed description is given in the following embodiments with reference to the accompanying drawings.

In an exemplary embodiment, an electronic device is provided. The electronic device includes: an acoustic input stage, an acoustic processing circuit, and an acoustic output stage. The acoustic input stage is for receiving an input acoustic signal and converting the input acoustic signal into an input digital signal, wherein the input digital signal comprises a low-frequency signal and a high-frequency signal. The acoustic processing circuit is for performing a filter gain compensation method for a specific frequency band on the input digital signal to generate an output digital signal. The acoustic output stage is for converting the output digital signal to an output acoustic signal that is played on a speaker of the electronic device. The filter gain compensation method includes the steps of: obtaining a plurality of fitting frequency gains; applying a windowed filter on each of a plurality of band-pass filters in a multi-segment band-pass filter corresponding to the high-frequency signal and different frequency bands of the low-frequency signal to obtain a windowed band-pass filter; calculating a high-frequency cancellation filter corresponding to the high-frequency signal of the input digital signal; calculating a fitting frequency relationship matrix corresponding to the multi-segment band-pass filter and the high-frequency cancellation filter; calculating a compensation gain for the high-frequency cancellation filter and each of the band-pass filters in the multi-segment band-pass filter according to the fitting frequency gains and the fitting frequency relationship matrix; updating a filter feature corresponding to each of the band-pass filters and the high-frequency cancellation filter; calculating an output signal according to the updated filter feature and the compensation gain corresponding to each of the windowed band-pass filters and the high-frequency cancellation filter; and synthesizing the output signal from each windowed band-pass filter and the high-frequency cancellation filter to the output acoustic signal.

In another exemplary embodiment, a filter gain compensation method for a specific frequency band for use in an electronic device is provided. The electronic device comprises an acoustic input stage, an acoustic processing circuit, and an acoustic output stage. The method includes the steps of: utilizing the acoustic input stage to receive an input acoustic signal and converting the input acoustic signal to an input digital signal; obtaining a plurality of fitting frequency gains; applying a windowed filter on each of a plurality of band-pass filters in a multi-segment band-pass filter corresponding to the high-frequency signal and different frequency bands of the low-frequency signal to obtain a windowed band-pass filter; calculating a high-frequency cancellation filter corresponding to the high-frequency signal of the input digital signal; calculating a fitting frequency relationship matrix corresponding to the multi-segment band-pass filter and the high-frequency cancellation filter; calculating a compensation gain for the high-frequency cancellation filter and each of the band-pass filters in the multi-segment band-pass filter according to the fitting frequency gains and the fitting frequency relationship matrix; updating a filter feature corresponding to each of the band-pass filters and the high-frequency cancellation filter; calculating an output signal according to the updated filter feature and the compensation gain corresponding to each of the windowed band-pass filters and the high-frequency cancellation filter; and synthesizing the output signal from each windowed band-pass filter and the high-frequency cancellation filter to the output acoustic signal that is played on the acoustic output stage of the electronic device.

BRIEF DESCRIPTION OF THE DRAWINGS

The present invention can be more fully understood by reading the subsequent detailed description and examples with references made to the accompanying drawings, wherein:

FIG. 3A is a diagram of distributions of different band-pass filters;

FIG. 3B is a diagram of distributions of different band-pass filters;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
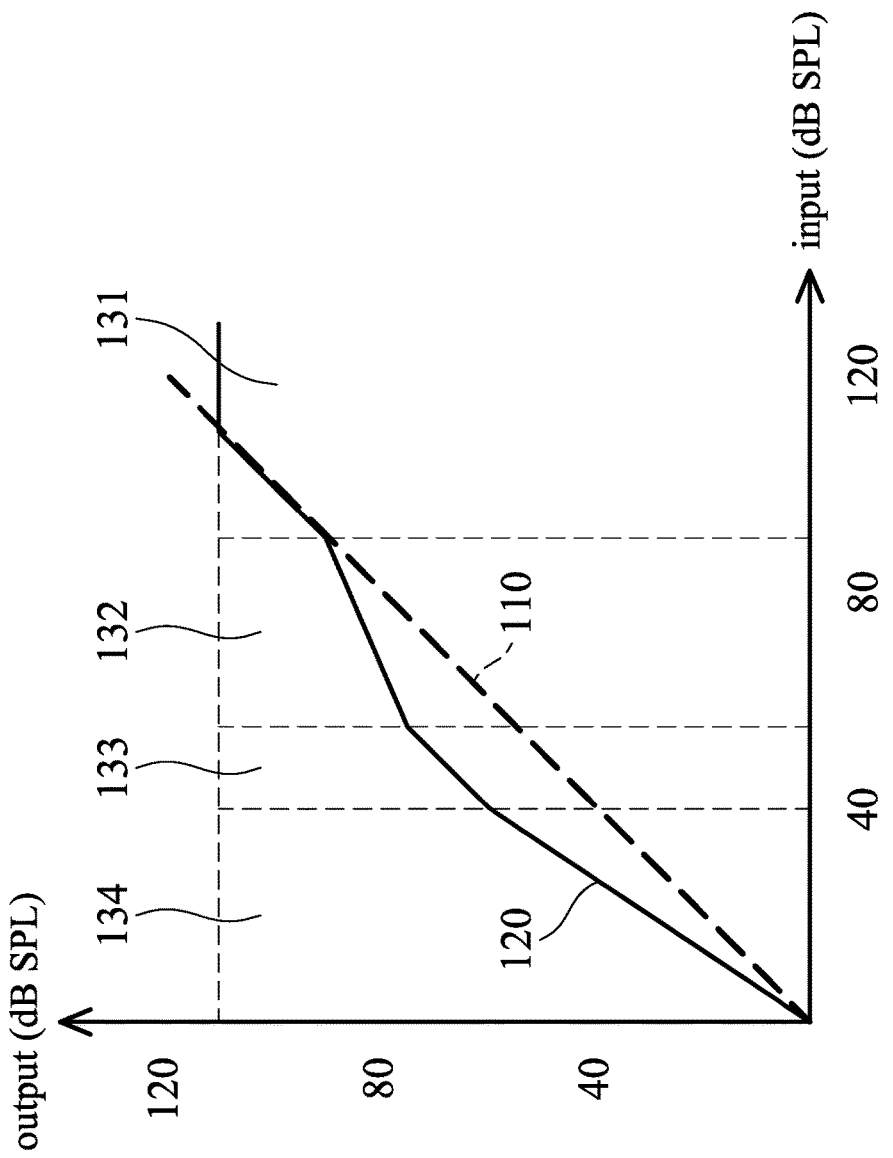
FIG. 1 is a diagram of a hearing compensation curve of an input acoustic signal after WDRC.
Figure 2:
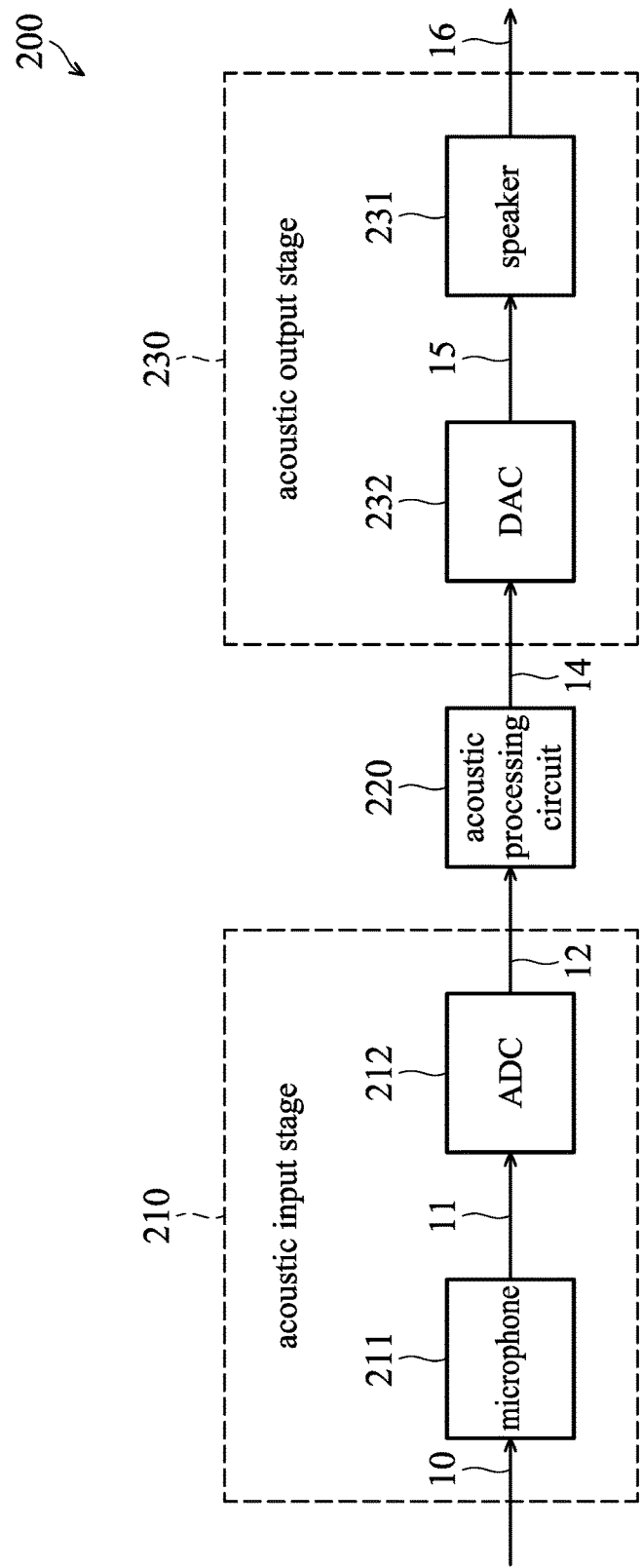
FIG. 2 is a schematic block diagram of an electronic device in accordance with an embodiment of the invention.

FIG. 2 is a schematic block diagram of an electronic device in accordance with an embodiment of the invention. In an embodiment, the electronic device 200 may be a smartphone, a tablet PC, or a portable electronic device, but the invention is not limited thereto. The electronic device 200 includes an acoustic input stage 210, an acoustic processing circuit 220, and an acoustic output stage 230. The acoustic input stage 210 includes a microphone 211 and an analog-to-digital converter (ADC) 212. The microphone is for receiving an input acoustic signal 10 (e.g. an analog acoustic signal) and to convert the input acoustic signal into an input electrical signal 11. The ADC 212 is for converting the input electrical signal 11 to an input digital signal 12 as the input of the acoustic processing circuit 220.

The acoustic processing circuit 220 performs a multi-frequency filter gain optimization method and/or a wide dynamic range compression process on the input digital signal 12 to generate an output digital output signal 14. Details for the multi-frequency filter gain optimization method will be described later. It should be noted that the aforementioned WDRC process includes a predetermined WDRC transition curve that is designed for the hearing characteristics of a specific user. For example, various tests for different hearing volumes and frequencies are performed in advance, thereby obtaining the WDRC transition curve for the specific user. In addition, when the amplitude of the input acoustic signal changes, the acoustic processing circuit 120 may also adjust the recovery time of the hearing aid 100 correspondingly, thereby providing a better user experience for the hearing-impaired user. In some embodiments, the acoustic processing circuit 220 may be a microcontroller, a processor, a digital signal processor (DSP), or an application-specific integrated circuit (ASIC), but the invention is not limited thereto.

Specifically, while performing the WDRC process, the acoustic processing circuit 120 may adjust the delay time of the output acoustic signal (i.e. recovery time) with reference to the recovery time factor associated with the input acoustic signal (i.e. the recovery time). The acoustic output stage 230 includes a receiver or speaker 231 and a digital-to-analog converter (DAC) 232. The DAC 232 is configured to convert the output digital signal 14 from the acoustic processing circuit 120 to an output electrical signal 15. The speaker 232 is for converting the output electrical signal 15 to an output acoustic signal 16 (e.g. an analog acoustic signal) that is played on the speaker 232 for the user to listen to. For the purposes of description, in the following embodiments, the conversion between the acoustic signals, electrical signals, and digital signals are omitted, and only the input acoustic signal and output acoustic signal are used.

It should be noted that, by using the multi-frequency filter gain optimization method of the present invention, the hearing-impaired user may listen to acoustic signals from his or her electronic device (e.g. smartphone or tablet PC) as if using a hearing aid. However, the speaker equipped in the electronic device fits all frequencies. That is, acoustic signals in each frequency will be amplified. Conversely, the receiver in a hearing aid is not designed to amplify an acoustic signal having a frequency over 4 KHz. Accordingly, if the WDRC process for the hearing aid is used on the electronic device, it may cause roaring sounds on the speaker of the electronic device, resulting in poor user experience for the hearing-impaired user.

FIGS. 3A and 3B are diagram of distributions of different band-pass filters. For example, conventionally, while using a time-domain band-pass filter, a corresponding band-pass filter is designed for each frequency band, such as the band-pass filter 310 for the low-frequency band, the band-pass filter 311 for the high-frequency band in FIG. 3A, and the band-pass filter 312 for the low-frequency band, and the band-pass filter 313 for the high-frequency band in FIG. 3B. However, the same filter gain should be kept for the central frequency of each frequency band. In addition, when there is a filter gain on the high-frequency portion, the discontinuity in the intersection area of different frequency bands becomes more serious.

Figure 4B:
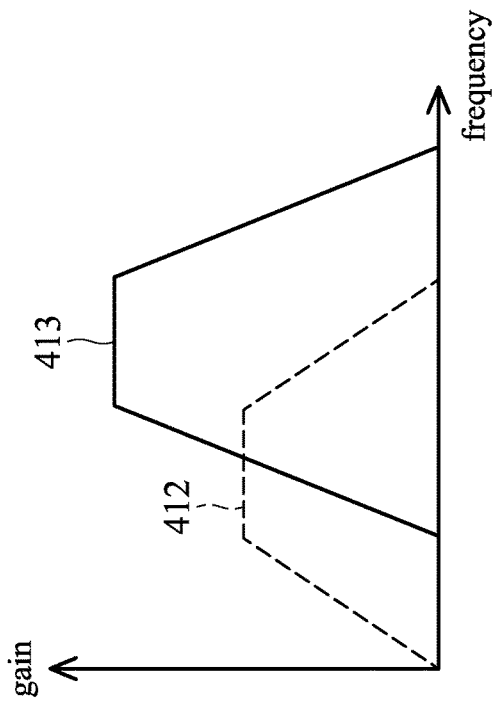
FIG. 4B is a diagram of the distributions of different band-pass filters in accordance with an embodiment of the invention.
Figure 4A:
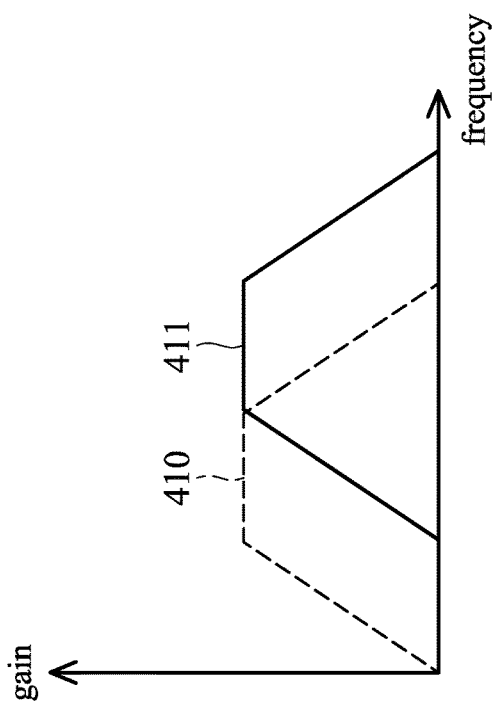
FIG. 4A is a diagram of the distributions of different band-pass filters in accordance with an embodiment of the invention.

FIGS. 4A and 4B are diagrams of the distributions of different band-pass filters in accordance with an embodiment of the invention. In an embodiment, band-pass filters that have larger filter frequency-bands are combined together as a joint filter that may have different filter gains on different frequencies, and have better continuity in the intersection area of different frequency bands, such as the band-pass filter 410 for the low-frequency band and the band-pass filter 411 for the high-frequency band in FIG. 4A, and the band-pass filter 412 for the low-frequency band and the band-pass filter 413 for the high-frequency band in FIG. 4B. It should be noted that, for the purposes of description, there are two frequency bands are used in FIG. 4A and FIG. 4B. In the following embodiments, examples having four frequency bands are described. Compared with the band-pass filters in FIG. 3A and FIG. 3B, the slope on the left and right sides of the band-pass filters in FIGS. 4A and 4B are flatter.

Figure 5:
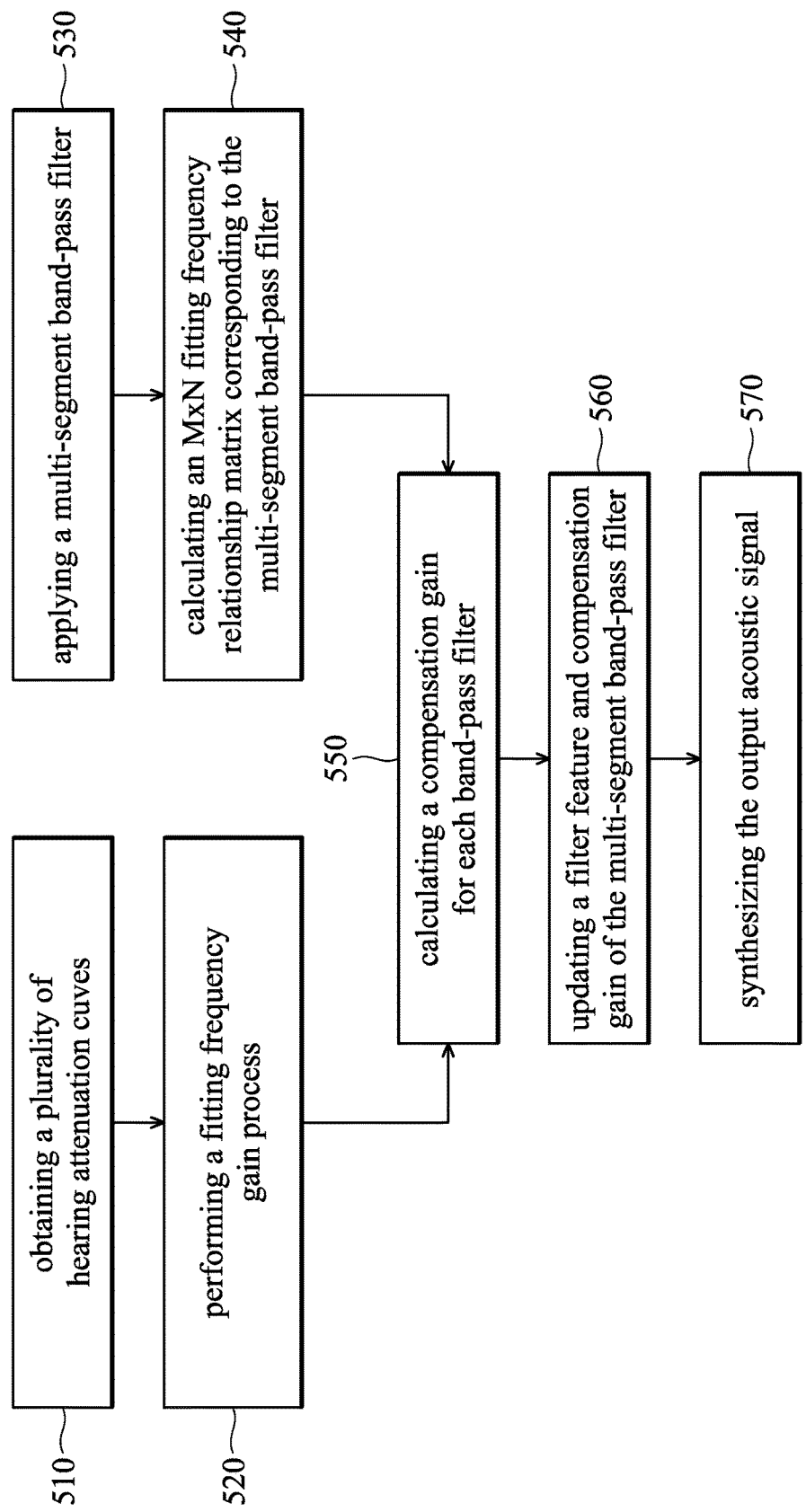
FIG. 5 is a flow chart of a multi-frequency filter gain optimization method in accordance with an embodiment of the invention.

FIG. 5 is a flow chart of a multi-frequency filter gain optimization method in accordance with an embodiment of the invention. In block 510, a hearing attenuation curve of a user is retrieved. For example, hearing tests on five matching frequencies $f_1 \sim f_5$ are performed for a hearing-impaired user, where the five matching frequencies are $f_1=250$ Hz, $f_2=500$ Hz, $f_3=1000$ Hz, $f_4=2000$ Hz, and $f_5=4000$ Hz. Thus, the hearing attenuations of the hearing-impaired user on each matching frequency are $H_{250}$, $H_{500}$, $H_{1000}$, $H_{2000}$, and $H_{4000}$. Then, the hearing attenuations on another matching frequency can be interpolated using these five matching frequencies, such as the hearing attenuations $H_{750}$, $H_{1500}$, and $H_{3000}$ for the matching frequencies 750 Hz, 1500 Hz, and 3000 Hz. For example, the hearing attenuations $H_{750}$, $H_{1500}$, and $H_{3000}$ can be calculated using the following equations:

$$H_{750}=0.5(H_{500}+H_{1000})$$

$$H_{1500}=0.5(H_{1000}+H_{2000})$$

$$H_{3000}=0.5(H_{2000}+H_{4000})$$

Accordingly, attenuations for 8 matching frequencies can be obtained, thereby building the hearing attenuation curve of the hearing-impaired user.

In block 520, a matching frequency gain process is performed. For example, different matching frequency gain methods can be used on different hearing attenuation curves, such as the ½ Gain method, ⅓ Gain method, POGOII method, Berger method, NAL-R method, etc., thereby obtaining gains $G_{250}$, $G_{500}$, $G_{750}$, $G_{1000}$, $G_{1500}$, $G_{2000}$, $G_{3000}$, and $G_{4000}$ for the fitting frequencies. In an embodiment, the NAL-R method is used in the present invention to calculate the gains on different test frequencies of the hearing attenuation curve, but the invention is not limited thereto.

In block 530, a multi-segment band-pass filter is applied. For example, a finite impulse response (FIR) band-pass filter $b_c(k)$ can be used in the present invention. The k-th coefficient of the FIR band-pass filter has a matching window $w(k)$. The multi-segment band-pass filter includes band-pass filters on different frequency bands. For example, the band-pass filter for each frequency band can be expressed as:

$$B_c(k)=b_c(k) \cdot w(k)$$

The first frequency band B1 is from 0 to 1000 Hz; the second frequency band B2 is from 1000 to 2000 Hz; the third frequency band B3 is from 2000 to 4000 Hz; and the fourth frequency band B4 is from 4000 to 8000 Hz.

In block 540, a fitting frequency relationship matrix corresponding to the band-pass filter $b_c(k)$ is calculated. For example, a sample frequency $f_s$ is used to design a sinusoidal wave $S_{f_j}(k)$ for the fitting frequencies, and the sinusoidal signal $S_{f_j}(k)$ can be expressed as:

$$S_{f_j}(k) = \cos\left(\frac{2\pi \cdot f_j \cdot k}{f_s}\right)$$

The sinusoidal signal $S_{f_j}(k)$ utilizes the band-pass filter of each frequency band to calculate the fitting frequency relationship matrix. For example, the band-pass filter of four frequency bands and 8 fitting frequency gains are used in the aforementioned steps, and thus the fitting frequency relationship matrix is an 8×4 matrix.

Specifically, if the first number of fitting frequency gains is M (i.e. a first number) and the second number of frequency bands is N, the size of the fitting frequency relationship matrix is M*N. In the embodiment, M is not equal to N.

For example, the fitting frequency relationship matrix can be expressed as:

$$T_{f_j,i}(8 \times 4) = \begin{bmatrix} \sum_{k=-K}^{K} S_{250}(k) \cdot B_1(k) & \cdots & \sum_{k=-K}^{K} S_{250}(k) \cdot B_4(k) \\ \vdots & \ddots & \vdots \\ \sum_{k=-K}^{K} S_{4000}(k) \cdot B_1(k) & \cdots & \sum_{k=-K}^{K} S_{400}(k) \cdot B_4(k) \end{bmatrix}$$

The summation equation $$\sum_{k=-K}^{K} S_{f_j}(k) \cdot B_i(k)$$

indicates the signal, which has a maximum amplitude of 1, and a vibration frequency of $f_j$, after the filter $B_i$. Briefly, although the band-pass filter $B_c(k)$ is obtained using the window function $w(k)$, two sides of each band-pass filter may have areas of intersection with other band-pass filters, and thus their mutual effect on each other should be estimated, for example, by the aforementioned fitting frequency relationship matrix.

In block 550, a filter gain of each band-pass filter $B_c(k)$ is calculated. For example, the fitting frequency gains of the band-pass filters can be expressed by the following transposed matrix:

$$\overline{g} = \begin{bmatrix} 10^{\frac{G_{250}}{20}} & 10^{\frac{G_{500}}{20}} & 10^{\frac{G_{750}}{20}} & 10^{\frac{G_{1000}}{20}} & 10^{\frac{G_{1500}}{20}} & 10^{\frac{G_{2000}}{20}} & 10^{\frac{G_{3000}}{20}} & 10^{\frac{G_{4000}}{20}} \end{bmatrix}^T$$

For example, the multi-segment band-pass filter is expressed as $B_c(k)$, and the fitting frequency relationship matrix is expressed as $T$. The fitting frequency gain matrix corresponding to the multi-segment band-pass filters is expressed as $\overline{g}$, and the gain of each band-pass filter is expressed as $\overline{R}$. The relationship of the aforementioned parameters can be expressed by the following equation:

$$\overline{g} = T \cdot \overline{R}$$

Meanwhile, the required gain of each band-pass filter can be expressed by the following equation:

$$\overline{R} = (T^T \cdot T)^{-1} \cdot T^T \cdot (\overline{g}) = [R_1 R_2 R_3 R_4]^T$$

In blocks 520 and 520, the fitting frequency gains $\overline{g}$ and the fitting frequency relationship matrix $T$ are calculated. Thus, the required gain for each band-pass filter $B_c(k)$ can be calculated according to the calculated fitting frequency gains $\overline{g}$ and fitting frequency relationship matrix $T$.

In block 560, the filter features and gain of the multi-segment band-pas filter is updated. For example, it is determined whether the phase Ri of each band-pass filter is a constructively interference or destructively interference. For example, the sign $\alpha_i$ for constructive interference or destructive interference can be expressed:

$$\alpha_i = \begin{cases} 1, & R_i \geq 0 \\ -1, & R_i < 0 \end{cases}$$

Then, the multi-segment band-pass filter feature $B'_i$ is updated by the equation $B'_i = \alpha_i \times B_i$, and the gain for each band-pass filter is updated by the equation: $R'_i = \alpha_i \times R_i$. The updated compensation gain for each band-pass filter is converted to a dB value $r_i$, such as $r_i = 20 \times \log(R'_i)$.

Figure 6:
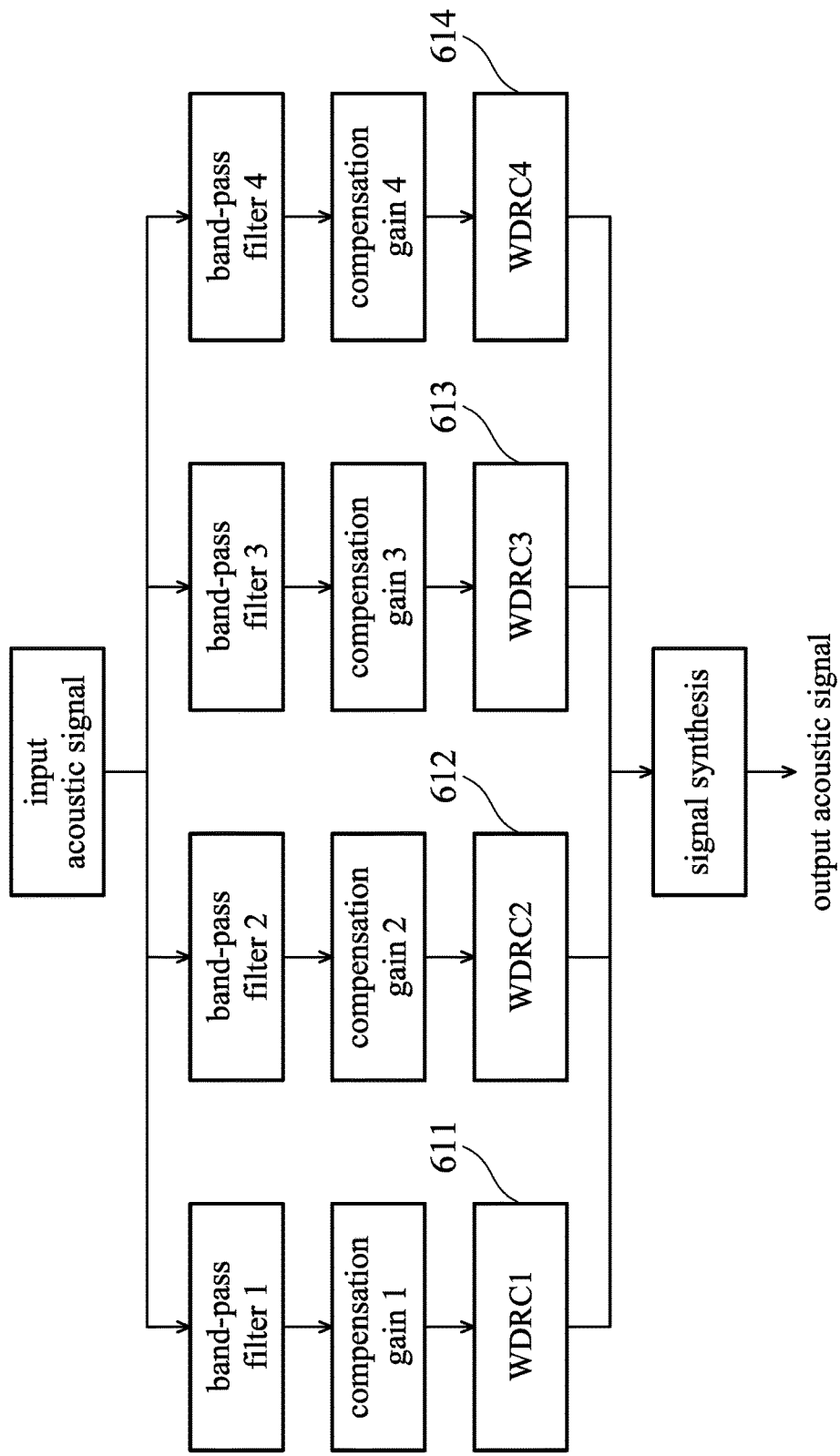
FIG. 6 is a diagram of the flow for synthesizing the output acoustic signal from the output signal of the input acoustic signal filtered by each band-pass filter in accordance with an embodiment of the invention.

In block 570, the output acoustic signal is synthesized. The acoustic processing circuit 220 may adjust the input acoustic signal according to the updated filter feature of each band-pass filter. For example, the input acoustic signal is divided into N frequency bands, and the WDRC gain for each frequency band can be calculated according to the updated compensation gain $r_i$. The compensation results of the frequency bands are synthesized into the output acoustic signal that is played on the speaker 231 of the electronic device 200. For example, the procedure of synthesizing the result of the frequency bands of the input acoustic signal using the band-pass filters is shown in FIG. 6.

Specifically, each band-pass filter has a corresponding compensation gain (e.g. r1~r4), and the acoustic signal passing through each band-pass filter is amplified with the corresponding compensation gain. Then, the result of each band-pass filter may be processed by a corresponding WDRC process, such as WDRC1~WDRC4 in blocks 611~614. Finally, the output acoustic signals from the WDRC1~WDRC4 can be synthesized to the output acoustic signal.

Figure 7:
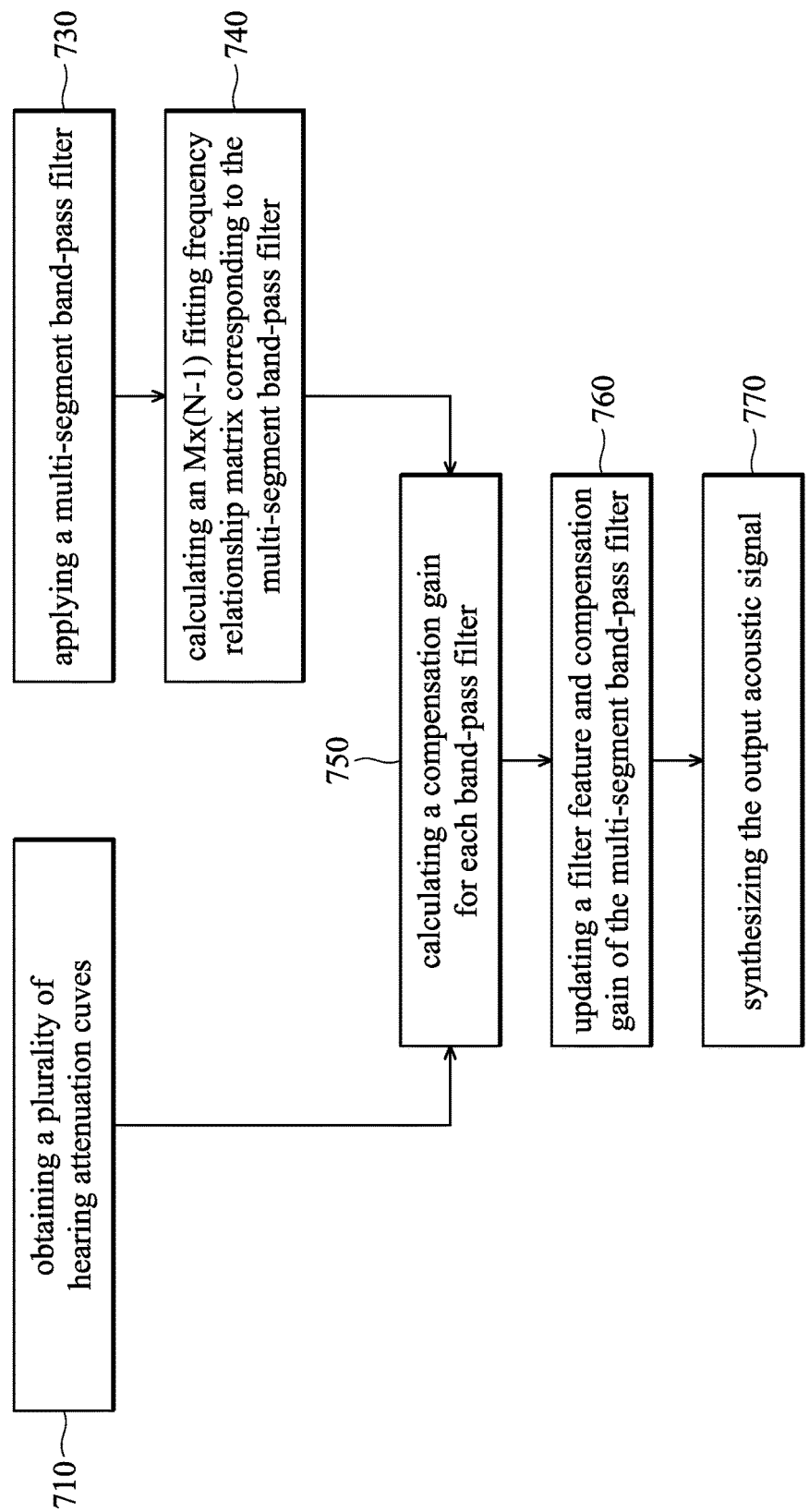
FIG. 7 is a flow chart of a multi-frequency filter gain optimization method in accordance with another embodiment of the invention.

FIG. 7 is a flow chart of a multi-frequency filter gain optimization method in accordance with another embodiment of the invention. In block 710, a plurality of fitting frequencies is obtained. For example, two methods can be used to obtain the fitting frequencies. In the first method, the fitting frequencies are pre-stored in a non-volatile memory (not shown) of the electronic device 200. The pre-stored fitting frequencies may meet the needs of the compensation gain of each frequency for a majority of hearing-impaired users. In the second method, the hearing attenuation curve of the hearing-impaired user is obtained. For example, hearing tests on five matching frequencies $f_1$~$f_5$ are performed for a hearing-impaired user, where the five matching frequencies are $f_1$=250 Hz, $f_2$=500 Hz, $f_3$=1000 Hz, $f_4$=2000 Hz, and $f_5$=4000 Hz. Thus, the hearing attenuations of the hearing-impaired user on each matching frequency are $H_{250}$, $H_{500}$, $H_{1000}$, $H_{200}0$, and $H_{4000}$. Then, the hearing attenuations on another matching frequency can be interpolated using these five matching frequencies, such as the hearing attenuations $H_{750}$, $H_{1500}$, and $H_{3000}$ for the matching frequencies 750 Hz, 1500 Hz, and 3000 Hz. For example, the hearing attenuations $H_{750}$, $H_{1500}$, and $H_{3000}$ can be calculated using the following equations:

$$H_{750} = 0.5(H_{500} + H_{1000})$$

$$H_{1500} = 0.5(H_{1000} + H_{2000})$$

$$H_{3000} = 0.5(H_{2000} + H_{4000})$$

Accordingly, attenuations for 8 matching frequencies can be obtained, thereby building the hearing attenuation curve of the hearing-impaired user.

In block 720, a matching frequency gain process is performed. For example, different matching frequency gain methods can be used on different hearing attenuation curves, such as the ½ Gain method, ⅓ Gain method, POGOII method, Berger method, NAL-R method, etc., thereby obtaining gains $G_{250}$, $G_{500}$, $G_{750}$, $G_{1000}$, $G_{1500}$, $G_{2000}$, $G_{3000}$, and $G_{4000}$ for the fitting frequencies. In an embodiment, the NAL-R method is used in the present invention to calculate the gains on different test frequencies of the hearing attenuation curve, but the invention is not so limited.

In block 730, a multi-segment band-pass filter is applied. For example, a finite impulse response (FIR) band-pass filter $b_c(k)$ can be used in the present invention. The k-th coefficient of the FIR band-pass filter has a matching window $w(k)$. The multi-segment band-pass filter includes band-pass filters on different frequency bands. For example, the band-pass filter for each frequency band can be expressed as:

$$B_c(k) = b_c(k) \cdot w(k)$$

The first frequency band B1 is from 0 to 1000 Hz; the second frequency band B2 is from 1000 to 2000 Hz; the third frequency band B3 is from 2000 to 4000 Hz; and the fourth frequency band B4 is from 4000 to 8000 Hz.

In block 740, an Mx(N−1) fitting frequency relationship matrix corresponding to the band-pass filter $B_c(k)$ is calculated. For example, a sample frequency $f_s$ is used to design a sinusoidal wave $S_{f_j}(k)$ for the fitting frequencies, and the sinusoidal signal $S_{f_j}(k)$ can be expressed as:

$$S_{f_j}(k) = \cos\left(\frac{2\pi \cdot f_j \cdot k}{f_s}\right)$$

Since the high-frequency portion of the output acoustic signal may cause roaring sounds on the speaker 231 of the electronic device 200, the gain of the high-frequency portion of the output acoustic signal should be limited. Specifically, the high-frequency portion of the output acoustic signal is the same as that of the input acoustic signal. That is, the gain of the high-frequency portion remains unchanged, and thus the gain of the high-frequency portion can be expressed by an 8×1 matrix $\overline{W}$ (i.e. 8 fitting frequency gains with the frequency band over 4 KHz):

$$\overline{W}(8 \times 1) = \begin{bmatrix} \sum_{k=-K}^{K} S_{250}(k) \cdot B_4(k) \\ \vdots \\ \sum_{k=-K}^{K} S_{4000}(k) \cdot B_4(k) \end{bmatrix}$$

In addition, the fitting frequency relationship matrix for the portion having frequencies lower than 4 KHz in the input acoustic signal is calculated. The fitting frequency relationship can be expressed by an 8×3 matrix (i.e. 8 fitting frequency gains with 3 frequency bands lower than 4 KHz. If the number of fitting frequency gains is M and the number of band-pass filters is N, the fitting frequency relationship matrix (i.e. high-frequency band-pass filter not included) can be expressed as an M×(N−1) matrix:

$$\overline{T}_{f_j,i}(8 \times 3) = \begin{bmatrix} \sum_{k=-K}^{K} S_{250}(k) \cdot B_1(k) & \cdots & \sum_{k=-K}^{K} S_{250}(k) \cdot B_3(k) \\ \vdots & \ddots & \vdots \\ \sum_{k=-K}^{K} S_{4000}(k) \cdot B_1(k) & \cdots & \sum_{k=-K}^{K} S_{4000}(k) \cdot B_3(k) \end{bmatrix}$$

The sinusoidal signal $S_{f_j}(k)$ passes through the band-pass filter of each frequency band, and the associated fitting frequency relationship matrix is calculated. For example, in the aforementioned steps, 8 fitting frequency gains and the band-pass filters for the 3 frequency bands lower than 4 KHz are used, and thus the fitting frequency relationship matrix is an 8×3 matrix in this embodiment.

The summation equation $$\sum_{k=-K}^{K} S_{f_j}(k) \cdot B_i(k)$$

indicates the signal, which has maximum amplitude of 1, and a vibration frequency of $f_j$, after the filter $B_i$. Briefly, although the band-pass filter $B_c(k)$ is obtained using the window function w(k), two sides of each band-pass filter may have areas of intersection with other band-pass filters, and thus their mutual effect on each other should be estimated, for example, by the aforementioned fitting frequency relationship matrix.

In block 750, a filter gain of each band-pass filter $B_c(k)$ is calculated. For example, the fitting frequency gains of the band-pass filters can be expressed by the following transposed matrix:

For example, the multi-segment band-pass filter is expressed as $B_c(k)$, and the fitting frequency relationship matrix is expressed as $\overline{T}$. The fitting frequency gain matrix corresponding to the multi-segment band-pass filters is expressed as $\overline{g}$, and the gain of each band-pass filter is expressed as $\overline{R}$. The relationship of the aforementioned parameters can be expressed by the following equation:

$$\overline{g} = \overline{T} \cdot \overline{R}$$

Meanwhile, the required gain of each band-pass filter can be expressed by the following equation:

$$\overline{R} = (\overline{T}^T \cdot \overline{T})^{-1} \cdot \overline{T}^T \cdot (\overline{g} - \overline{W}) = [R_1 R_2 R_3]^T$$

The gain of the fourth frequency band over 4 KHz is fixed at 1.

In blocks 720 and 740, the fitting frequency gains $\overline{g}$ and the fitting frequency relationship matrix $\overline{T}$ are calculated. Thus, the required gain for each band-pass filter $B_c(k)$ can be calculated according to the calculated fitting frequency gains $\overline{g}$ and fitting frequency relationship matrix $\overline{T}$.

In block 760, the filter features and gain of the multi-segment band-pas filter are updated. For example, it is determined whether the phase Ri of each band-pass filter is constructive interference or destructive interference. For example, the sign $\alpha_i$ for constructive interference or destructive interference can be expressed:

$$\alpha_i = \begin{cases} 1, & R_i \geq 0 \\ -1, & R_i < 0 \end{cases}$$

Then, the multi-segment band-pass filter feature $B'_i$ is updated by the equation $B'_i = \alpha_i \times B_i$, and the gain for each band-pass filter is updated by the equation: $R'_i = \alpha_i \times R_i$. The updated compensation gain for each band-pass filter is converted to a dB value $r_i$, such as $r_i = 20 \times \log(R'_i)$.

In block 770, the output acoustic signal is synthesized. The acoustic processing circuit 220 may adjust the input acoustic signal according to the updated filter feature of each band-pass filter. For example, the input acoustic signal is divided into N frequency bands, and the WDRC gain for each frequency band can be calculated according to the updated compensation gain $r_i$. The compensation results of the frequency bands are synthesized into the output acoustic signal that is played on the speaker 231 of the electronic device 200. For example, the flow of synthesizing the result of the frequency bands of the input acoustic signal using the band-pass filters is shown in FIG. 6.

Specifically, each band-pass filter has a corresponding compensation gain (e.g. r1~r4), and the acoustic signal passing through each band-pass filter is amplified with the corresponding compensation gain. Then, the result of each band-pass filter may be processed by a corresponding WDRC process, such as WDRC1~WDRC4 in blocks 611~614. Finally, the output acoustic signals from the WDRC1~WDRC4 can be synthesized to the output acoustic signal.

Compared with the procedure in FIG. 5, the high-frequency acoustic signal can be processed exclusively according to the characteristics of the speaker of the electronic device in the flow in FIG. 7, so that no roaring sound is $$\overline{g} = \begin{bmatrix} 10^{\frac{G_{250}}{20}} & 10^{\frac{G_{500}}{20}} & 10^{\frac{G_{750}}{20}} & 10^{\frac{G_{1000}}{20}} & 10^{\frac{G_{1500}}{20}} & 10^{\frac{G_{2000}}{20}} & 10^{\frac{G_{3000}}{20}} & 10^{\frac{G_{4000}}{20}} \end{bmatrix}^T$$

incurred by the high-frequency acoustic signal on the speaker of the electronic device. Additionally, the compensation gain of the remaining portion other than the high-frequency portion can be optimized.

Figure 8:
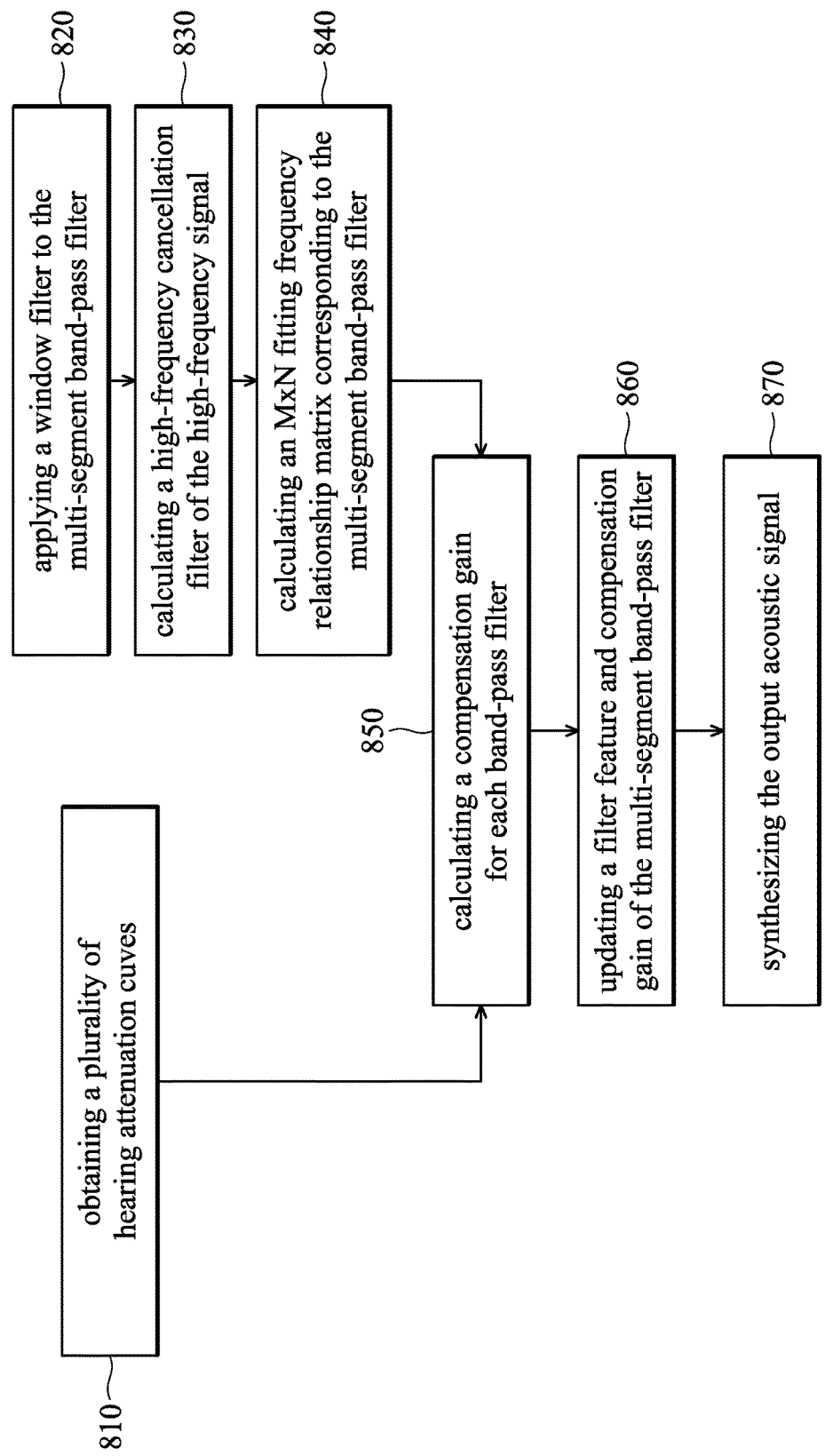
FIG. 8 is a flow chart of a filter gain compensation method for a specific frequency band using windowed filters in accordance with an embodiment of the invention.

FIG. 8 is a flow chart of a filter gain compensation method for a specific frequency band using windowed filters in accordance with an embodiment of the invention. In block 810, a plurality of fitting frequencies is obtained. For example, there are two methods that can be used to obtain the fitting frequencies. In the first method, the fitting frequencies are pre-stored in a non-volatile memory (not shown) of the electronic device 200. The pre-stored fitting frequencies may suit the needs of the compensation gain of each frequency for a majority of hearing-impaired users. In the second method, the hearing attenuation curve of the hearing-impaired user is obtained. For example, hearing tests on five matching frequencies $f_1 \sim f_5$ are performed for a hearing-impaired user, where the five matching frequencies are $f_1=250$ Hz, $f_2=500$ Hz, $f_3=1000$ Hz, $f_4=2000$ Hz, and $f_5=4000$ Hz. Thus, the hearing attenuations of the hearing-impaired user on each matching frequency are $H_{250}$, $H_{500}$, $H_{1000}$, $H_{2000}$, and $H_{4000}$. Then, the hearing attenuations on another matching frequency can be interpolated using these five matching frequencies, such as the hearing attenuations $H_{750}$, $H_{1500}$, and $H_{3000}$ for the matching frequencies 750 Hz, 1500 Hz, and 3000 Hz. For example, the hearing attenuations $H_{750}$, $H_{1500}$, and $H_{3000}$ can be calculated using the following equations:

$$H_{750}=0.5(H_{500}+H_{1000})$$

$$H_{1500}=0.5(H_{1000}+H_{2000})$$

$$H_{3000}=0.5(H_{2000}+H_{4000})$$

Accordingly, attenuations for 8 matching frequencies can be obtained, thereby building the hearing attenuation curve of the hearing-impaired user.

Then, a matching frequency gain process is performed. For example, different matching frequency gain methods can be used on different hearing attenuation curves, such as the ½ Gain method, ⅓ Gain method, POGOII method, Berger method, NAL-R method, etc., thereby obtaining gains $G_{250}$, $G_{500}$, $G_{750}$, $G_{1000}$, $G_{1500}$, $G_{2000}$, $G_{3000}$, and $G_{4000}$ for the fitting frequencies. In an embodiment, the NAL-R method is used in the present invention to calculate the gains on different test frequencies of the hearing attenuation curve, but the invention is not limited thereto.

In block 820, a multi-segment band-pass filter is applied. For example, a finite impulse response (FIR) band-pass filter $b_c(k)$ can be used in the present invention. The k-th coefficient of the FIR band-pass filter has a matching window $w(k)$. The multi-segment band-pass filter includes band-pass filters on different frequency bands. For example, the band-pass filter for each frequency band can be expressed as:

$$B_c(k)=b_c(k) \cdot w(k)$$

When four frequency bands are used, the first frequency band B1 is from 0 to 1000 Hz; the second frequency band B2 is from 1000 to 2000 Hz; the third frequency band B3 is from 2000 to 4000 Hz; and the fourth frequency band B4 is from 4000 to 8000 Hz. In some embodiments, the multi-segment band-pass filter may include different numbers of frequency bands. For example, the frequency band B0 is from 0 to 1000 Hz; the frequency band B1 is from 1000 to 2000 Hz; the frequency band is from 2000 to 3000 Hz; the frequency band B3 is from 3000 to 4000 Hz; and the frequency band B5 is over 4000 Hz, but the invention is not limited thereto.

The original band-pass filters have narrower transition frequency bands. When windowed filters $w(k)$ are applied on the original band-pass filters, the windowed band-pass filters have wider transition frequency bands, and the attenuation of their stop bands is larger than 20 dB. For example, the relationship of the original band-pass filters and windowed band-pass filters can be defined as: $B'_1(k)=B_1(k)$, $B'_2(k)=B_2(k)$, and $B'_3(k)=B_3(k)$.

In block 830, a high-frequency cancellation filter of the high-frequency acoustic signal is calculated. For example, the high-frequency acoustic signal over 4 KHz may easily induce roaring sounds on the speaker of the electronic device. Accordingly, the band-pass filter $B_4(k)$ for the fourth frequency band B4 is independently defined, and the windowed band-pass filter for the frequency band B5 is defined as $B'_5(k)=B_4(k)$. Specifically, the acoustic processing circuit 220 applies the high-frequency cancellation filter on the high-frequency signal of the input acoustic signal, and thus the transition frequency bands can be compensated.

In block 840, an M×N fitting frequency relationship matrix corresponding to each band-pass filter $B_c(k)$ and the high-frequency cancellation filter are calculated. For example, a sample frequency $f_s$ is used to design a sinusoidal wave $S_{f_j}(k)$ for the fitting frequencies, and the sinusoidal signal $S_{f_j}(k)$ can be expressed as:

$$S_{f_j}(k) = \cos\left(\frac{2\pi \cdot f_j \cdot k}{f_s}\right)$$

It should be noted that the widths of stop bands of the original band-pass filters or the windowed band-pass filters are less than 20 dB. The primary difference between the original band-pass filters and the windowed band-pass filters is the width of the transition frequency bands. Accordingly, the aforementioned difference can be used to compensate neighboring frequency bands without placing too high a burden on the high-frequency pass bands. For example, the function $B'_4(k)$ can be defined as $B'_4(k)=b_4(k)-B_4(k)$, that is calculated by subtracting the waveform of the windowed band-pass filter from that of the original band-pass filters on the high-frequency band (i.e. over 4 KHz).

Since the high-frequency portion of the output acoustic signal may cause roaring sounds on the speaker 231 of the electronic device 200, the gain of the high-frequency portion of the output acoustic signal should be limited. Specifically, the high-frequency portion of the output acoustic signal is the same as that of the input acoustic signal. That is, the gain of the high-frequency portion remains unchanged, and thus the gain of the high-frequency portion can be expressed by an 8×1 matrix $\overline{W}$ (i.e. 8 fitting frequency gains with the frequency band over 4 KHz):

$$\overline{W}(8 \times 1) = \begin{bmatrix} \sum_{k=-K}^{K} S_{250}(k) \cdot B_4(k) \\ \vdots \\ \sum_{k=-K}^{K} S_{4000}(k) \cdot B_4(k) \end{bmatrix}$$

In addition, the compensation gains for the acoustic signals having frequencies lower than 4 KHz are adjusted to obtain the corresponding fitting frequency relationship matrix:

$$T(8\times 4) = \begin{bmatrix} \sum_{k=-K}^{K} S_{250}(k)\cdot B'_1(k) & \cdots & \sum_{k=-K}^{K} S_{250}(k)\cdot B'_4(k) \\ \vdots & \ddots & \vdots \\ \sum_{k=-K}^{K} S_{4000}(k)\cdot B'_1(k) & \cdots & \sum_{k=-K}^{K} S_{4000}(k)\cdot B'_4(k) \end{bmatrix}$$

The sinusoidal signal $S_{fj}(k)$ passes through the band-pass filter of each frequency band, and the associated fitting frequency relationship matrix is calculated. For example, in the aforementioned steps, 8 fitting frequency gains, the high-frequency cancellation filter, and the band-pass filters for 3 frequency bands lower than 4 KHz are used, and thus the fitting frequency relationship matrix is an 8×4 matrix in this embodiment.

The summation equation $$\sum_{k=-K}^{K} S_{fj}(k)\cdot B_i(k)$$

indicates the signal, which has a maximum amplitude of 1, and a vibration frequency of $f_j$, after the filter $B_i$. Briefly, although the band-pass filter $B_c(k)$ is obtained using the window function $w(k)$, two sides of each band-pass filter may have areas of intersection with other band-pass filters, and thus their mutual effect on each other should be estimated, for example, by the aforementioned fitting frequency relationship matrix.

In block 850, a filter gain of each band-pass filter $B_c(k)$ is calculated. For example, the fitting frequency gains of the band-pass filters can be expressed by the following transposed matrix:

$$\overline{g} = \begin{bmatrix} 10^{\frac{G_{250}}{20}} & 10^{\frac{G_{500}}{20}} & 10^{\frac{G_{750}}{20}} & 10^{\frac{G_{1000}}{20}} & 10^{\frac{G_{1500}}{20}} & 10^{\frac{G_{2000}}{20}} & 10^{\frac{G_{3000}}{20}} & 10^{\frac{G_{4000}}{20}} \end{bmatrix}^T$$

For example, the multi-segment band-pass filter is expressed as $B_c(k)$, and the fitting frequency relationship matrix is expressed as $\overline{T}$. The fitting frequency gain matrix corresponding to the multi-segment band-pass filters is expressed as $\overline{g}$, and the gain of each band-pass filter is expressed as $\overline{R}$. The relationship of the aforementioned parameters can be expressed by the following equation:

$$\overline{g} = \overline{T}\cdot\overline{R}$$

Meanwhile, the required gain of each band-pass filter can be expressed by the following equation:

$$\overline{R} = (\overline{T}^T\cdot\overline{T})^{-1}\cdot\overline{T}^T\cdot(\overline{g}-\overline{W}) = [R_1 R_2 R_3 R_4]^T$$

The gain $R_5$ of the frequency band over 4 KHz is fixed at 1. Specifically, if there are N frequency bands for the band-pass filters, N+1 filter gains will be obtained, wherein the gain R5 is the fixed compensation gain for the high-frequency acoustic signal, and the gains R1~R4 are individual filter compensation gains for the band-pass filters that are calculated according to the windowed band-pass filters and the high-frequency cancellation filter.

In block 860, the filter features and gain of the multi-segment band-pass filter are updated. For example, the acoustic processing circuit 220 calculates the filter feature $B''_i$ of the multi-segment band-pass filter based on the following equation:

$$B''_i = R_i \times B'_i$$

In addition, the updated compensation gain for each frequency band is converted to a dB value, such as:

$$r_i = 20 \times \log(|R'_i|)$$

In block 870, the output acoustic signal is synthesized. The acoustic processing circuit 220 may adjust the input acoustic signal according to the updated filter feature $B''_i$ of each band-pass filter. For example, the input acoustic signal is divided into N frequency bands, and the WDRC gain for each frequency band can be calculated according to the updated compensation gain $r_i$. The compensation results of the frequency bands are synthesized into the output acoustic signal that is played on the speaker 231 of the electronic device 200. For example, the flow of synthesizing the result of the frequency bands of the input acoustic signal using the band-pass filters is shown in FIG. 9.

Figure 9:
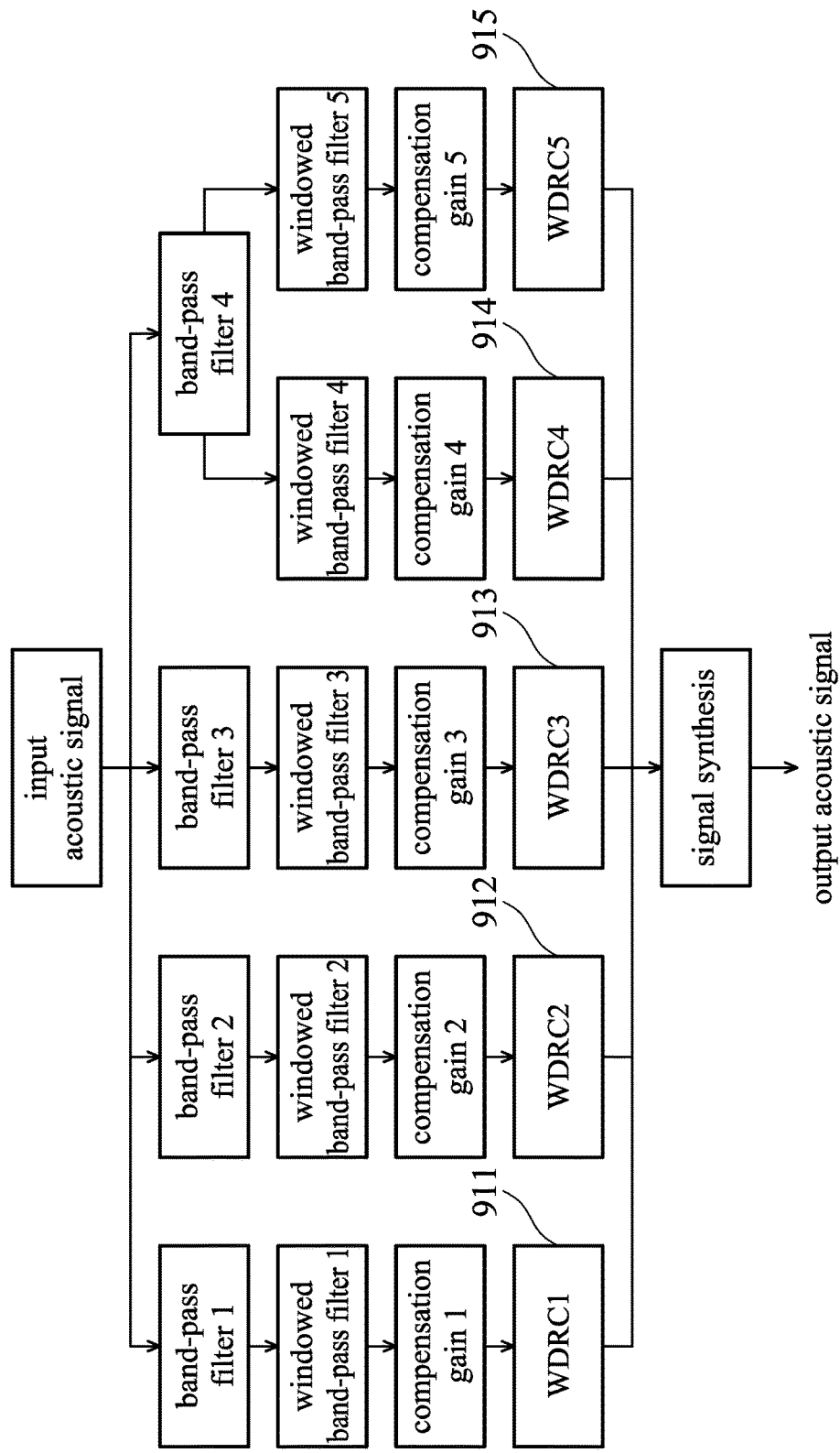
FIG. 9 is a diagram of the flow for synthesizing the output acoustic signal from the output signal of the input acoustic signal filtered by each band-pass filter in accordance with the embodiment of FIG. 8.

FIG. 9 is a diagram of the flow for synthesizing the output acoustic signal from the output signal of the input acoustic signal filtered by each band-pass filter in accordance with the embodiment of FIG. 8. Specifically, each band-pass filter has a corresponding compensation gain (e.g. r1~r4), and the compensation gain r5 for the high-frequency acoustic signal is fixed at 1. Then, the input acoustic signal for each band-pass filter is amplified with the compensation gain, and the output signal of each band-pass filter is processed by a corresponding WDRC process, such as WDRC1~WDRC5 in blocks 911~915. Finally, the output acoustic signals from the WDRC1~WDRC5 can be synthesized to the output acoustic signal.

Compared with the flow in FIG. 5, a windowed high-frequency cancellation filter is used in the flow in FIG. 8. The windowed high-frequency cancellation filter has acoustic signals having frequencies lower than 4 KHz, and the high-frequency acoustic signals having frequencies over 4 KHz are cancelled out. Thus, the windowed high-frequency cancellation filter may keep compensation gains for lower frequency bands (e.g. similar to the method in FIG. 5.). Meanwhile, the compensation gain for the high-frequency acoustic signal is not increased too much, and thus no roaring sound is incurred by the high-frequency portion of the output acoustic signal that is kept as the high-frequency portion of the input acoustic signal (e.g. similar to the method in FIG. 7).

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device, comprising:
an acoustic input stage, for receiving an input acoustic signal and converting the input acoustic signal into an input digital signal, wherein the input digital signal comprises a low-frequency signal and a high-frequency signal;
an acoustic processing circuit, for performing a filter gain compensation method for a specific frequency band on the input digital signal to generate an output digital signal; and
an acoustic output stage, for converting the output digital signal to an output acoustic signal that is played on a speaker of the electronic device,
wherein the filter gain compensation method comprises:
obtaining a plurality of fitting frequency gains;
applying a windowed filter on each of a plurality of band-pass filters in a multi-segment band-pass filter corresponding to the high-frequency signal and different frequency bands of the low-frequency signal to obtain a windowed band-pass filter;
calculating a high-frequency cancellation filter corresponding to the high-frequency signal of the input digital signal;
calculating a fitting frequency relationship matrix corresponding to the multi-segment band-pass filter and the high-frequency cancellation filter;
calculating a compensation gain for the high-frequency cancellation filter and each of the band-pass filters in the multi-segment band-pass filter according to the fitting frequency gains and the fitting frequency relationship matrix;
updating a filter feature corresponding to each of the band-pass filters and the high-frequency cancellation filter;
calculating an output signal according to the updated filter feature and the compensation gain corresponding to each of the windowed band-pass filters and the high-frequency cancellation filter; and
synthesizing the output signal from each windowed band-pass filter and the high-frequency cancellation filter to the output acoustic signal.

2. The electronic device as claimed in claim 1, wherein the fitting frequency gains correspond to frequencies of 250 Hz, 500 Hz, 750 Hz, 1000 Hz, 1500 Hz, 2000 Hz, 3000 Hz, and 4000 Hz.

3. The electronic device as claimed in claim 1, wherein the compensation gain of the windowed band-pass filter corresponding to the high-frequency signal is 1.

4. The electronic device as claimed in claim 1, wherein the high-frequency cancellation filter is obtained by subtracting the windowed band-pass filter from the band-pass filter corresponding to the high-frequency signal.

5. The electronic device as claimed in claim 1, wherein the acoustic processing circuit updates the filter feature of each band-pass filter and the high-frequency cancellation filter by multiplying the filter feature of each band-pass filter and the high-frequency cancellation filter with the corresponding compensation gain.

6. A filter gain compensation method for a specific frequency band for use in an electronic device, wherein the electronic device comprises an acoustic input stage, an acoustic processing circuit, and an acoustic output stage, the method comprising:
utilizing the acoustic input stage to receive an input acoustic signal and converting the input acoustic signal to an input digital signal, wherein the input digital signal comprises a low-frequency signal and a high-frequency signal;
obtaining a plurality of fitting frequency gains;
applying a windowed filter on each of a plurality of band-pass filters in a multi-segment band-pass filter corresponding to the high-frequency signal and different frequency bands of the low-frequency signal to obtain a windowed band-pass filter;
calculating a high-frequency cancellation filter corresponding to the high-frequency signal of the input digital signal;
calculating a fitting frequency relationship matrix corresponding to the multi-segment band-pass filter and the high-frequency cancellation filter;
calculating a compensation gain for the high-frequency cancellation filter and each of the band-pass filters in the multi-segment band-pass filter according to the fitting frequency gains and the fitting frequency relationship matrix;
updating a filter feature corresponding to each of the band-pass filters and the high-frequency cancellation filter;
calculating an output signal according to the updated filter feature and the compensation gain corresponding to each of the windowed band-pass filters and the high-frequency cancellation filter; and
synthesizing the output signal from each windowed band-pass filter and the high-frequency cancellation filter to the output acoustic signal that is played on the acoustic output stage of the electronic device.

7. The method as claimed in claim 6, wherein the fitting frequency gains correspond to frequencies of 250 Hz, 500 Hz, 750 Hz, 1000 Hz, 1500 Hz, 2000 Hz, 3000 Hz, and 4000 Hz.

8. The method as claimed in claim 6, wherein the compensation gain of 2 the windowed band-pass filter corresponding to the high-frequency signal is 1.

9. The method as claimed in claim 6, wherein the high-frequency 2 cancellation filter is obtained by subtracting the windowed band-pass filter from the band-pass filter corresponding to the high-frequency signal.

10. The method as claimed in claim 6, further comprising:
updating the filter feature of each band-pass filter and the high-frequency cancellation filter by multiplying the filter feature of each band-pass filter and the high-frequency cancellation filter with the corresponding compensation gain.

* * * * *